US006898083B1

(12) United States Patent
Hornung

(10) Patent No.: US 6,898,083 B1
(45) Date of Patent: May 24, 2005

(54) HEAT SINK INTEGRATED RETENTION SYSTEM

(75) Inventor: Craig Warren Hornung, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/705,592

(22) Filed: Nov. 10, 2003

(51) Int. Cl.⁷ ................................................ H05K 7/20
(52) U.S. Cl. ................ 361/704; 361/709; 361/719; 257/718; 257/719; 257/727; 165/80.3; 165/185; 174/16.3
(58) Field of Search ................................ 361/702–704, 361/707, 709, 719; 257/718, 722, 727; 174/16.1, 16.3; 165/80.3, 185; 24/457, 458; 248/316.7; 411/516

(56) References Cited

U.S. PATENT DOCUMENTS

| 5,448,449 A | 9/1995 | Bright et al. ............... 361/704 |
| 6,201,697 B1 * | 3/2001 | McCullough ................ 361/704 |
| 6,318,452 B1 | 11/2001 | Lee ............................ 165/80.3 |
| 6,480,384 B2 | 11/2002 | Lo .............................. 361/704 |
| 6,522,545 B2 | 2/2003 | Shia et al. .................. 361/704 |
| 6,542,367 B2 | 4/2003 | Shia et al. .................. 361/703 |
| 6,574,109 B1 * | 6/2003 | McHugh et al. ............ 361/719 |
| 6,724,629 B1 * | 4/2004 | Augustin et al. ........... 361/704 |

* cited by examiner

Primary Examiner—Boris Chervinsky

(57) ABSTRACT

A heat sink assembly for a circuit board component is provided. that includes a heat sink base, a frame coupled to the base, and a cam positionable relative to the base to lock the heat base to the circuit board component. The frame includes an actuator that has a first post and a second post. Each post has an upper end, a lower end, and a shaft portion therebetween. The lower end includes a retention lug. A cross beam interconnects the shaft portions of the posts. The frame further includes a board lock and the cam includes a lever coupled to the cam. The cam engages the actuator to move the actuator relative to the frame from a first position to a second position to lock the heat sink base to the circuit board component. The heat sink remains in the locked position when the lever is rotated from the second position to the first position.

18 Claims, 7 Drawing Sheets

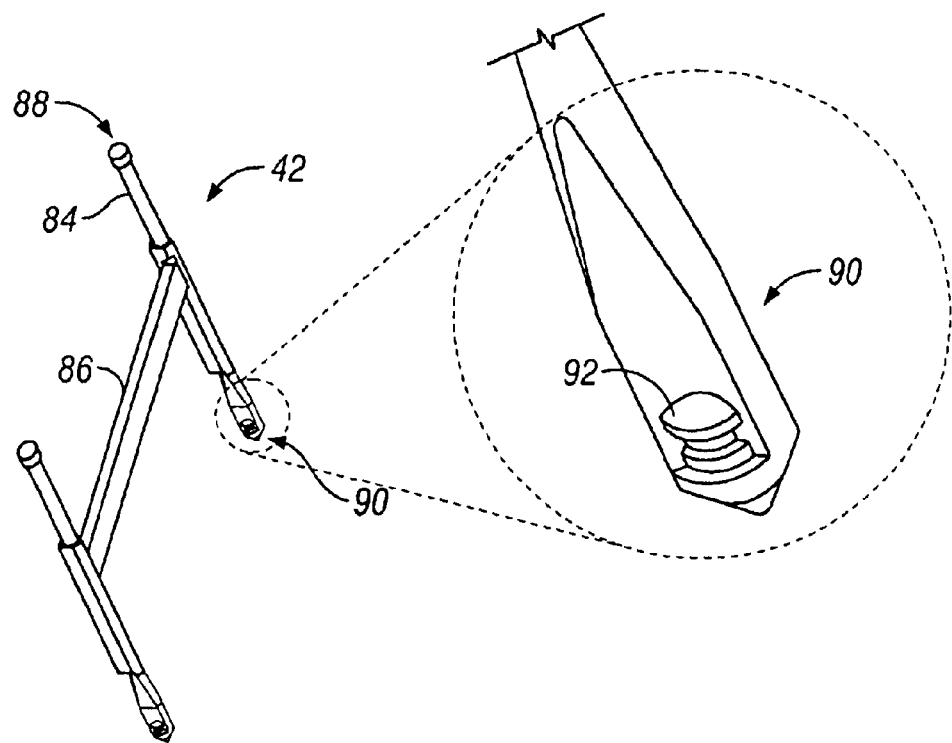
FIG. 4
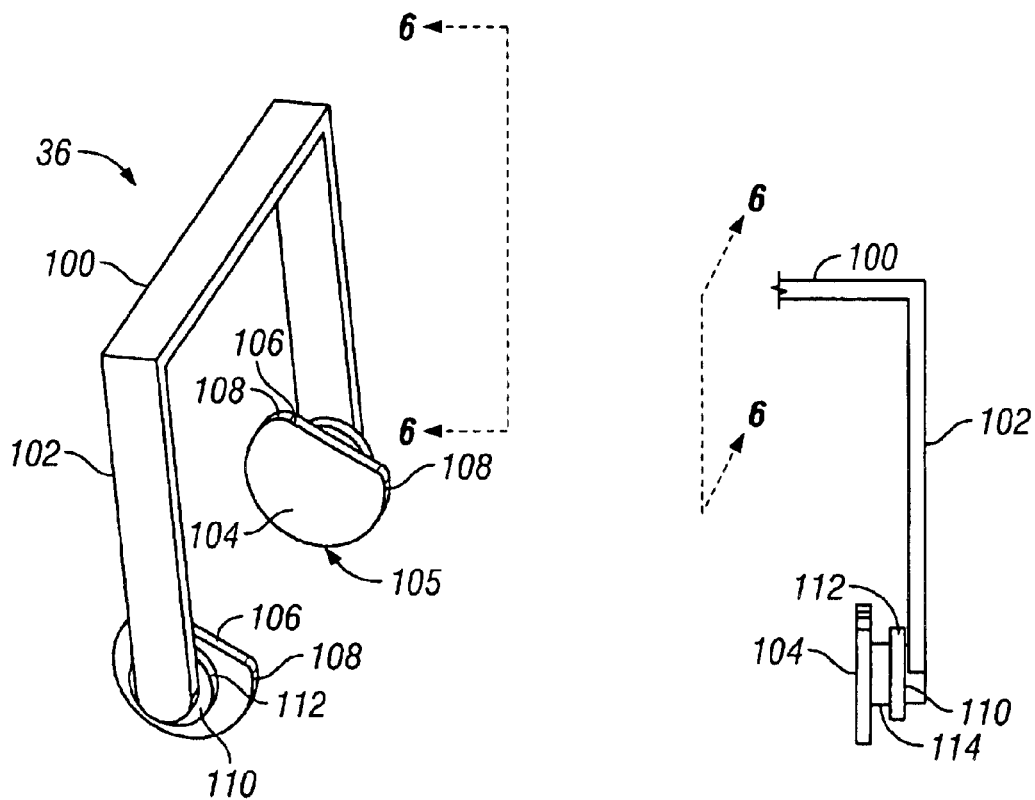
FIG. 5  FIG. 6

HEAT SINK INTEGRATED RETENTION SYSTEM

BACKGROUND OF THE INVENTION

The invention relates generally to heat sinks for electronic devices, and more specifically, to mounting and retention systems for heat sinks.

The use of heat sinks on electronic components is well known. Typically, a heat sink is arranged in close contact with a heat generating electronic component, such as a Central Processing Unit (CPU). As the power density of such components increases, heat transfer from the heat generating component to the surrounding environment becomes more and more critical to the proper operation of the component. Heat generated by the component is transferred to the heat sink and then dissipated from the heat sink to the surrounding air. One type of heat sink includes a metallic core in the form of a base plate. Heat dissipating fins extend from the base plate to increase the surface area of the heat sink. Heat transferred from the component to the base plate is spread throughout the base plate and to the fins fixed to the base plate. To further facilitate the dissipation of heat from the electronic component, a fan can be used to circulate air about outer surfaces of the fins and the base of the heat sink.

In the case of a CPU, current circuit board designs typically provide for the heat sink to be mounted directly on top of the CPU in a retention module that is in turn mounted on the circuit board. A spring clip or other fastening mechanism is used to retain the heat sink in the retention module. Thus, the installation of the heat sink is a multi-step process that involves multiple components with both assembly time and component costs adding to the cost of the product.

BRIEF DESCRIPTION OF THE INVENTION

In one embodiment of the invention, a heat sink assembly for a circuit board component is provided. The assembly includes a heat sink base, a frame coupled to the base, and a cam positionable relative to the base to lock the heat sink base to the circuit board component.

Optionally, the frame includes an actuator that has a first post and a second post. Each post has an upper end, a lower end, and a shaft portion therebetween. The lower end includes a retention lug. A cross beam interconnects the shaft portions of the posts. The frame further includes a board lock and the cam includes a lever coupled to the cam. The cam engages the actuator to move the actuator relative to the frame from a first position to a second position to lock the heat sink base to the circuit board component. The heat sink remains in the locked position when the lever is rotated from the second position to the first position.

In another embodiment, a heat sink assembly for a circuit board component is provided that includes a heat sink base, an actuator coupled to the base, and a board lock for coupling the base to the circuit board in heat transfer relationship to the circuit board component. The board lock includes a pair of retention barbs, and the actuator is configured to spread the pair of retention barbs and apply a normal force to a surface of the circuit board component when the actuator is moved from a first position to a second position.

In another embodiment, a heat sink retention assembly is provided that includes a heat sink base and a frame. The frame includes a board lock that is configured to be received in a circuit board. An actuator is received in the flame and is movable with respect to the frame from an open position to a locked position wherein the board lock is activated to retain the retention assembly on the circuit board. A cam is disposed between the frame and the actuator. The cam is rotatable from a first position to a second position to move the actuator between the open position and the locked position.

BRIEF DESCRIPTION OF THE DRAWINGS

FIG. 4 is a perspective view of the actuator of FIG. 2.

FIG. 5 is a perspective view of a cam lever in accordance with an exemplary embodiment of the present invention.

FIG. 6 is a partial front elevational view of the cam lever of FIG. 5 taken along sight line 6—6.

DETAILED DESCRIPTION OF THE INVENTION

Figure 1:
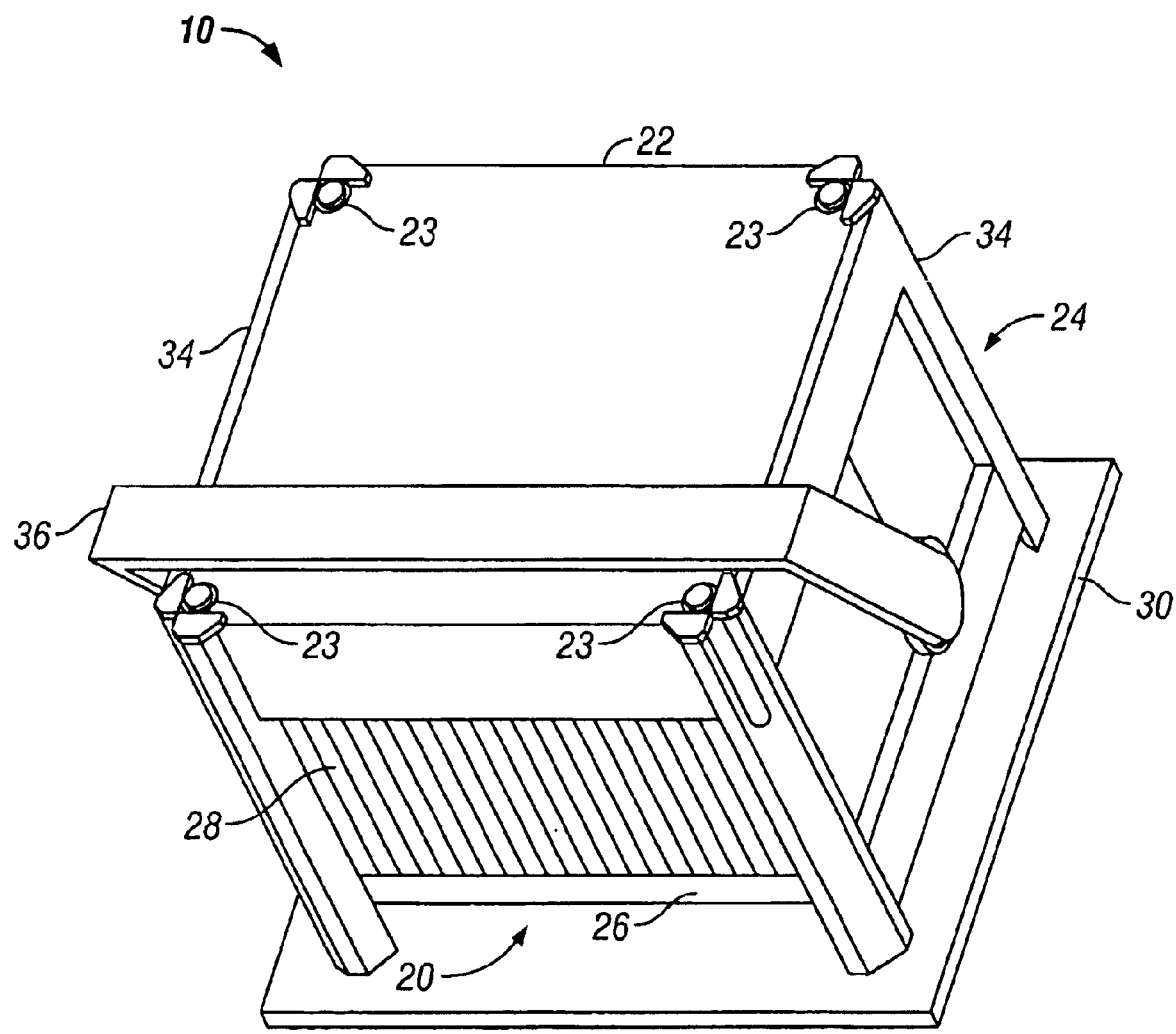
FIG. 1 is a perspective view of a heat sink integrated retention system in accordance with an exemplary embodiment of the present invention.

FIG. 1 illustrates a perspective view of an integrated retention system 10 for a heat sink assembly in accordance with an exemplary embodiment of the present invention. The integrated retention system 10 includes a heat sink assembly 20, a fan 22, and a housing 24. The heat sink assembly 20 includes a heat sink base 26 with a plurality of cooling fins 28 extending upwardly from the base 26. The heat sink base 26 and the fins 28 are typically fabricated from metal such as aluminum or copper, and further, the heat sink base 26 and the fins 28 may be fabricated from the same or different metals. For instance, in one embodiment the heat sink base 26 may be made of copper while the fins 28 may be made of aluminum.

The fan 22 is mounted above the cooling fins 28 for circulating air about the cooling fins 28 and the heat sink base 26 to facilitate the transfer of heat from a heat generating component (not shown). When in use, the heat sink base 26 is positioned in contact with the heat generating component such that heat generated by the component is transferred to the heat sink base 26 and the cooling fins 28 and then to the surrounding air.

The housing 24 holds and mounts the heat sink assembly 20 and the fan 22 to a circuit board 30 so that the heat sink base 26 is in contact with the heat generating component, and applies a compressive load to produce a normal contact force between the heat sink base 26 and the heat generating component. The housing 24 includes a pair of frame assemblies 34 and a cam lever 36.

Figure 2:
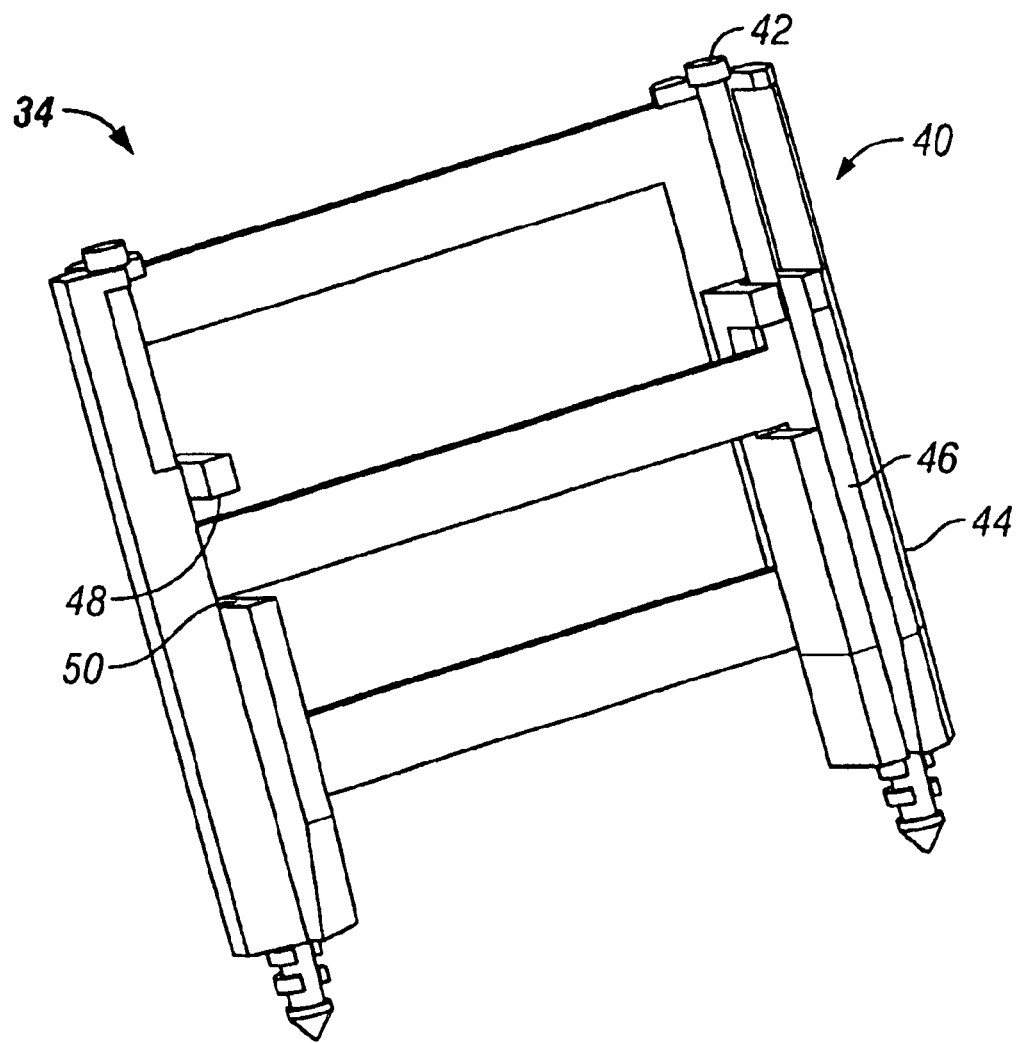
FIG. 2 is a perspective view of a frame assembly used in the system of FIG. 1.

FIG. 2 illustrates one of the frame assemblies 34 which are identical to each other. The frame assembly 34 includes a frame member 40 and an actuator 42. The frame member 40 includes a pair of legs 44 that each include a channel 46 that receives the actuator 42. The actuator 42 is slidable within the channel 46 between an upper stop 48 and a lower stop 50 on each leg 44. The frame member 40 and the actuator 42 are fabricated from a resilient material that exhibits some degree of flexibility. In one embodiment, the material is nylon 66™.

Figure 3:
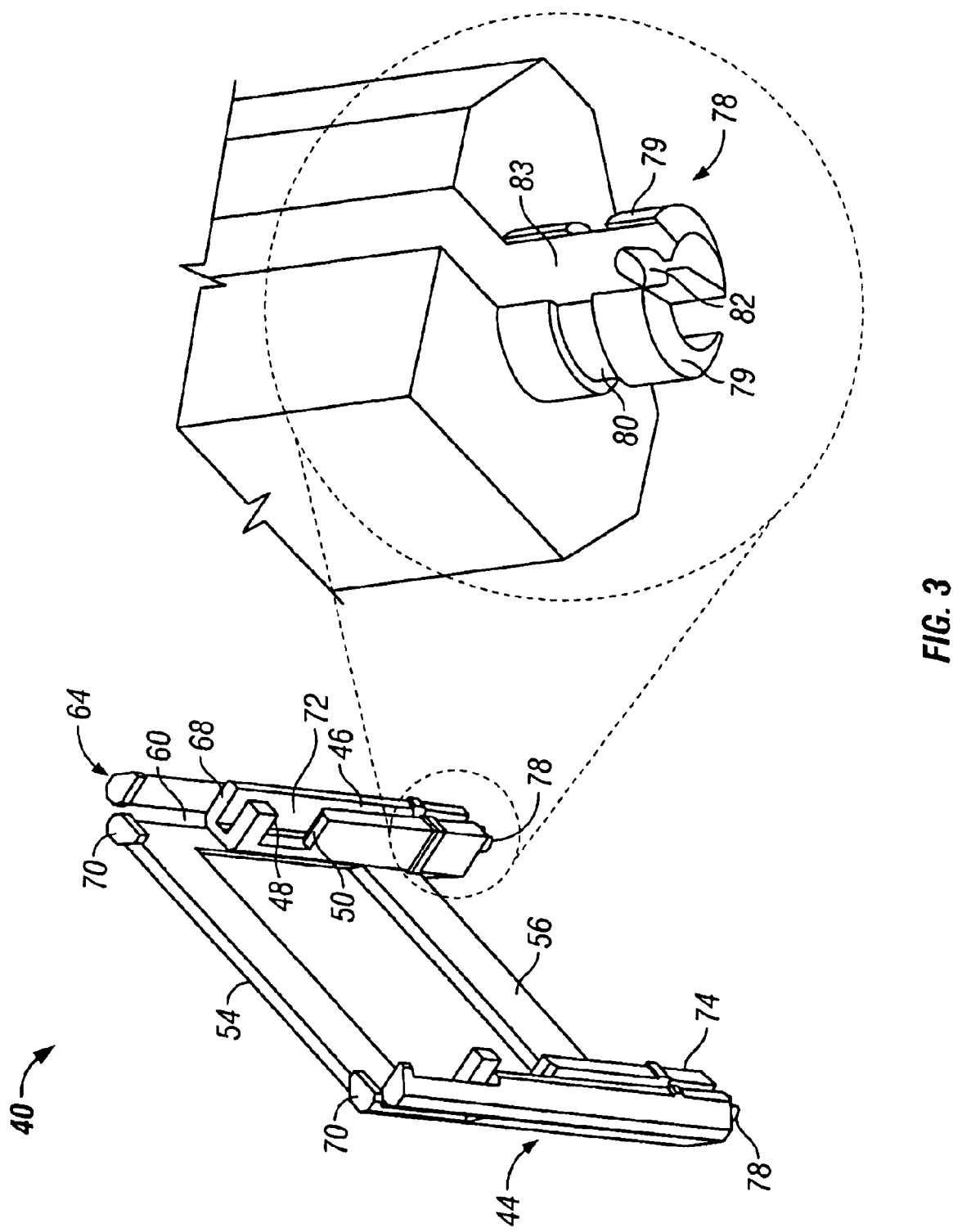
FIG. 3 is a perspective view of the frame member of FIG. 2.

FIG. 3 illustrates the frame member 40 in detail. The frame member 40 includes upper and lower cross members 54 and 56 respectively. Cross members 54 and 56 are substantially parallel to each other and interconnect the legs 44. Each leg 44 includes a slot 60 at an upper end 64 which extends downward to a ledge 68. The ledges 68 at each of the four legs 44 cooperate to define a platform for the fan 22 (shown in FIG. 1). The upper end 64 of each leg 44 includes a pair of tabs 70 that retain the fan 22 when the integrated system 10 is assembled. The legs 44 each include a cut out 72 that defines the upper and lower actuator stops 48 and 50 respectively. Each leg 44 includes an attachment end 74 for connecting the frame member to the circuit board 30. Each attachment end 74 includes a board lock 78 for attachment to a mounting hole (not shown) on the circuit board 30. The board lock 78 comprises a pair of retention barbs 79 positioned one on each side of the channel 46 extending through the leg 44 such that the retention barbs 79 are separable relative to each other. The retention barbs 79 include a retaining groove 80 on an outer surface thereof and a recess 82 within the channel 46 on an inner surface 83 of the retention barbs 79. The retaining groove 80 and the recess 82 cooperate to lock the legs 44 to the circuit board 30 as will be described below.

FIG. 4 is a perspective view illustrating the actuator 42 in detail. In one embodiment, the actuator 42 is in the shape of an H beam and includes a pair of posts 84 that are interconnected by a substantially horizontal cross beam 86. The posts 84 are slidably received in the channels 46 (shown in FIG. 3) of the legs 44. The cross beam 86 is received in the cut out 72 (shown in FIG. 2) in the legs 44. The upper and lower stops 48 and 50 (shown in FIG. 3) in the cutout 72 interfere with the cross beam 86 to define a range of movement of the actuator 42 within the legs 44. The posts 84 have an upper end 88 and a lower end 90. The lower end 90 of each post 84 includes a serrated retention lug 92 that spreads the attachment ends 74 (shown in FIG. 3) of the legs 44 when the actuator posts 84 are drawn upward through the channel 46. The retaining groove 80 (shown in FIG. 3) on the board locks 78 are sized to receive a thickness of the circuit board 30 (shown in FIG. 1) to lock the legs 44 onto the circuit board 30 when the board lock retention barbs 79 on the attachment ends 74 of the legs 44 are separated. The retention lugs 92 are configured to be retained in the pockets 82 in the retention barbs 79 to hold the board locks 78 in a separated position. Once the board locks 78 are in the locked position, manual thumb pressure is required to be applied to the upper ends 88 of the posts 84 to drive the retention lugs 92 from the pockets 82 to release the integrated retention system 10 from the circuit board 30.

FIG. 5 illustrates a perspective view of the cam lever 36. FIG. 6 illustrates a frontal view of the cam lever 36. The cam lever 36 includes a handle 100 and a pair of lever arms 102. A cam 104 is provided at the end of each lever arm 102. Each cam 104 has an outer periphery 105 that includes an open flat section 106 positioned between smaller raised locking flat sections 108. A disc 110 is also provided adjacent to cams 104 to provide a bearing surface 112 for rotating the cam lever 36. A short pivot shaft 114 displaces the cam 104 from the disk 110.

When installed in the integrated system 10, the cams 104 are positioned to engage the cross beam 86 of the actuator 42. The cam lever 36 is rotatable from a released position to a locked position. In the released position, the open flat section 106 of the cam 104 faces upward and is adjacent to cross beam 86 of the actuator 42. In the locked position, one of the raised locking flat sections 108 engages the cross beam 86 to operate the actuator 42. The locking flat section 108 provide a detent position so that the cam lever 36 will remain in the locked position once rotated to the locked position.

Figure 7:
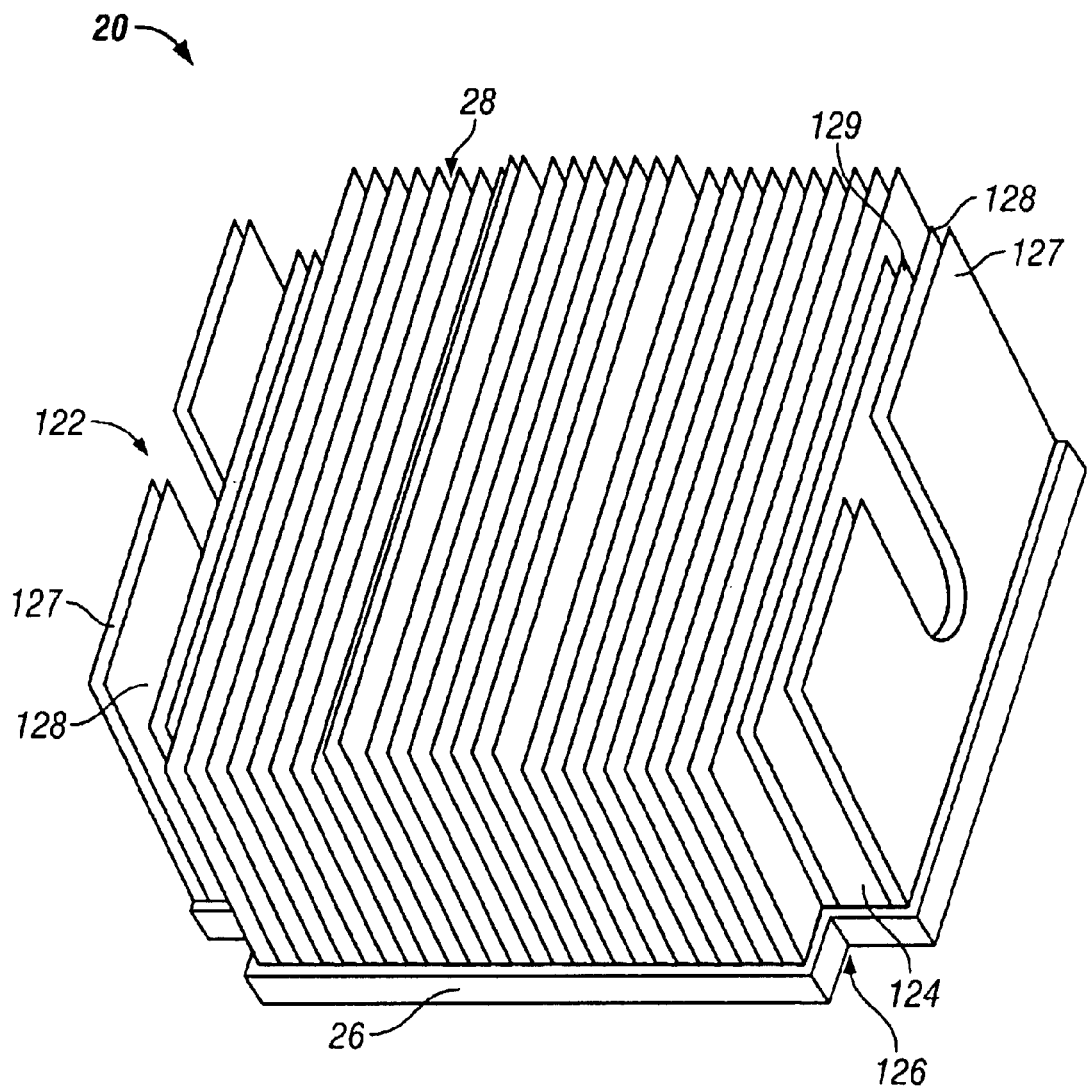
FIG. 7 is a perspective view of the heat sink assembly of FIG. 1.

FIG. 7 is a perspective view of the heat sink assembly 20. The heat sink assembly 20 includes cam guides 122 formed in fins 127 and 128 and channels 124 formed between fins 128 and 129. The cam guides 122 are sized to receive the cam lever pivot shaft 114. The channels 124 are provided to receive the cams 104. The heat sink base also includes clearance notches 126 that receive the frame legs 44 when the integrated system 10 is assembled.

In assembling the integrated system 10, the upper ends 88 of the actuator posts 84 (shown in FIG. 4) are inserted through the mounting holes 23 (see FIG. 1) in the fan 22. The actuator 42 is then joined with the frame member 40 by inserting the posts 84 of the actuator 42 into the channels 46 of the legs 44 so that the cross beam 86 is positioned within the cutout 72 in the legs 44 and with the lower end 90 of the actuator posts 84 extended from the board locks 78.

The cam lever 36 is placed over the frame assemblies 34 such that the upper cross members 54 is positioned between the lever arms 102 while the cam 104 is positioned between the lower cross members 56. The cam lever 36 is then rotated to a position where the open flat section 106 is facing upward. Finally, the fan 22 is held in place between the ledges 68 and the tabs 70 on the legs 44 while the frame assemblies 34 are placed onto the heat sink assembly 20 with the cams 104 and the actuator cross beams 86 received in the heat sink channels 124. The integrated system 10 can now be mounted on the circuit board 30 and locked into place by rotation of the cam lever 36.

Figure 9:
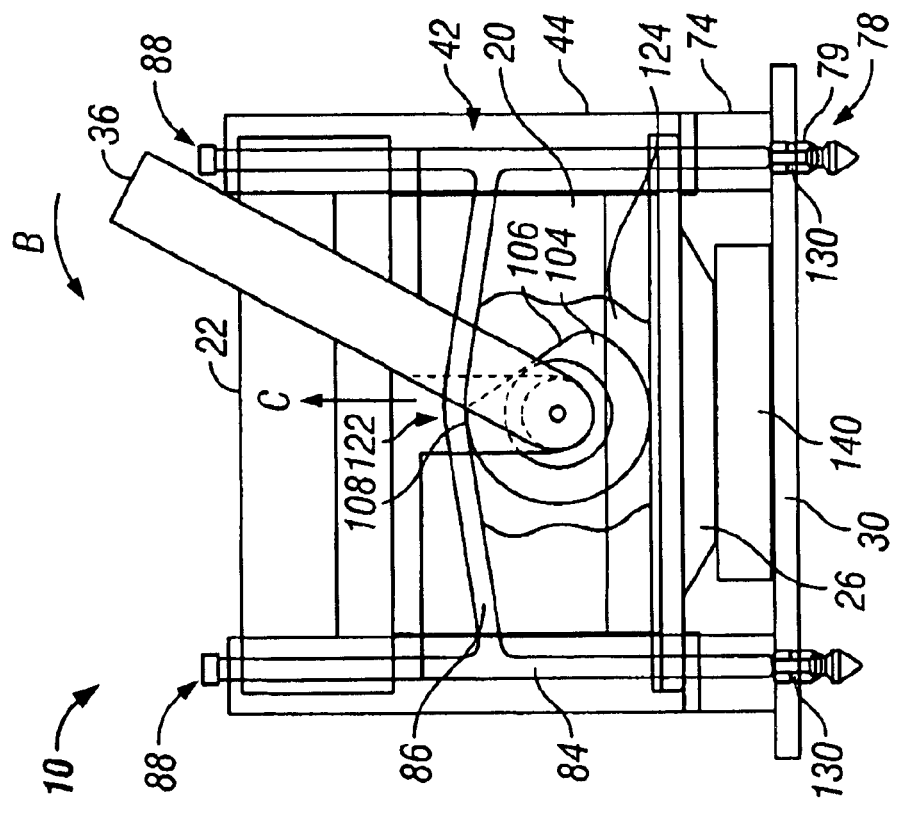
FIG. 9 is a schematic view of the heat sink integrated retention system of FIG. 8 in a locked state.
Figure 8:
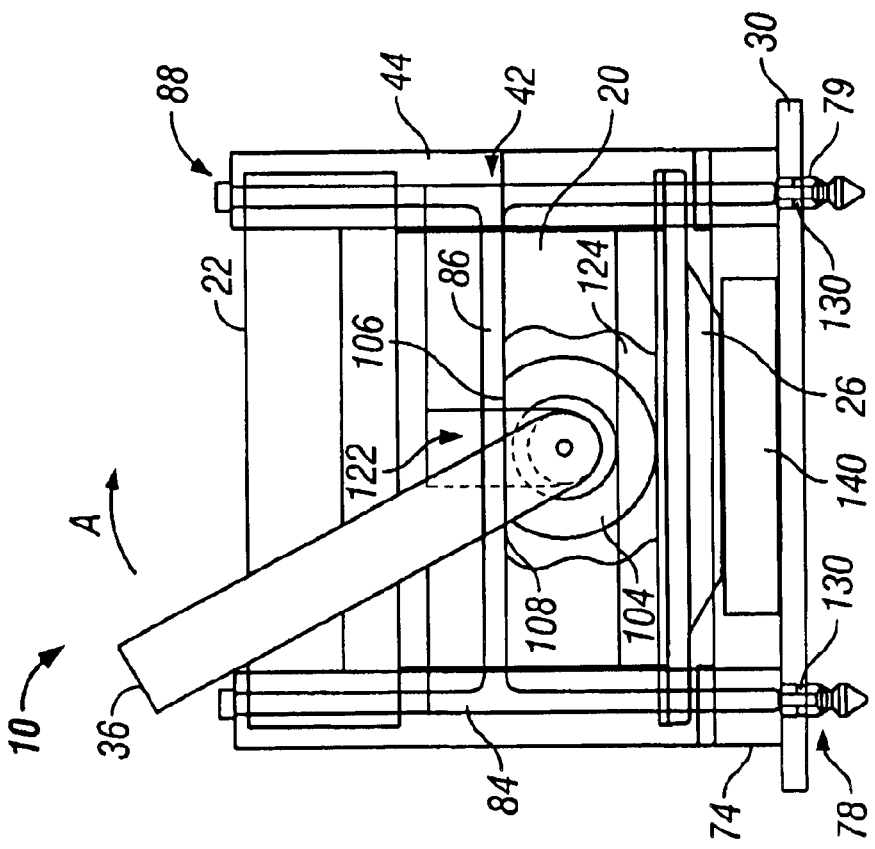
FIG. 8 is a schematic view of an assembled heat sink integrated retention system in an unlocked state.

FIGS. 8 and 9 are schematic views of an assembled integrated retention system 10 illustrating the operation of the cam 104 and actuator 42 in mounting the integrated system 10 for cooling a heat generating component 140. In FIG. 8, the cam 104 is positioned in the heat sink channel 124. The actuator cross beam 86 is engaged with the cam 104 at the open flat section 106. The integrated system 10 is positioned on the circuit board 30 with the heat sink base 26 in contact with the heat generating component 140. The upper ends 88 of the actuator posts 84 are depressed such that the board lock retention barbs 79 are not separated and pass unrestricted through the circuit board mounting holes 130. In this condition, the integrated retention system 10 is not locked on the circuit board 30. From this position, rotation of the cam lever 36 in the direction of arrow A drives the actuator 42 upward which causes the retention barbs 79 to separate to engage and retain the circuit board 30 in the retaining groove 80 (shown in FIG. 3) to lock the system 10 to the circuit board 30.

In FIG. 9, the cam lever 36 has been rotated in the direction of arrow A to lock the integrated retention system 10 to the circuit board 30. When the cam lever 36 is rotated, the locking flat section 108 on the cam 104 engages the actuator cross beam 86 driving the actuator posts 84 upward. The upward movement of the actuator posts 84 brings the retention lugs 92 (shown in FIG. 4) into engagement with the attachment ends 74, and the retention barbs 79 of board locks 78 (shown in FIG. 3). The retention lugs 92 separate the retention barbs 79 into the circuit board mounting holes 130 such that the retention groove 80 (shown in FIG. 3) retains the circuit board 30 locking the integrated system 10 to the circuit board 30. The lugs 92 are received in the pockets 82 (shown in FIG. 3) of the retention barbs 79 so that the integrated system 10 remains locked onto the circuit board 30 even if the cam lever 36 is rotated in the direction of arrow B to release the actuator 42. When it is desired to unlock the integrated system 10, physical thumb pressure is applied to the upper ends 88 of the actuator posts 84 to drive the actuator posts 84 downward, disengaging the lugs 92 from the pockets 82 of the retention barbs 79. The retention barbs 79 then return to their unseparated position allowing removal of the integrated system 10 from the circuit board 30.

As shown in FIG. 9, when the cam lever 36 is rotated in the direction of arrow A to lock the integrated system 10 to the circuit board 30, the actuator cross beam 86 is elastically deflected in an upward direction by the cam 104. The combined rotation of the cam lever 36 and the deflection of the cross beam 86 generate a downward compressive force resulting in a normal contact force between the heat sink base 26 and a heat generating component 140.

Figure 10:
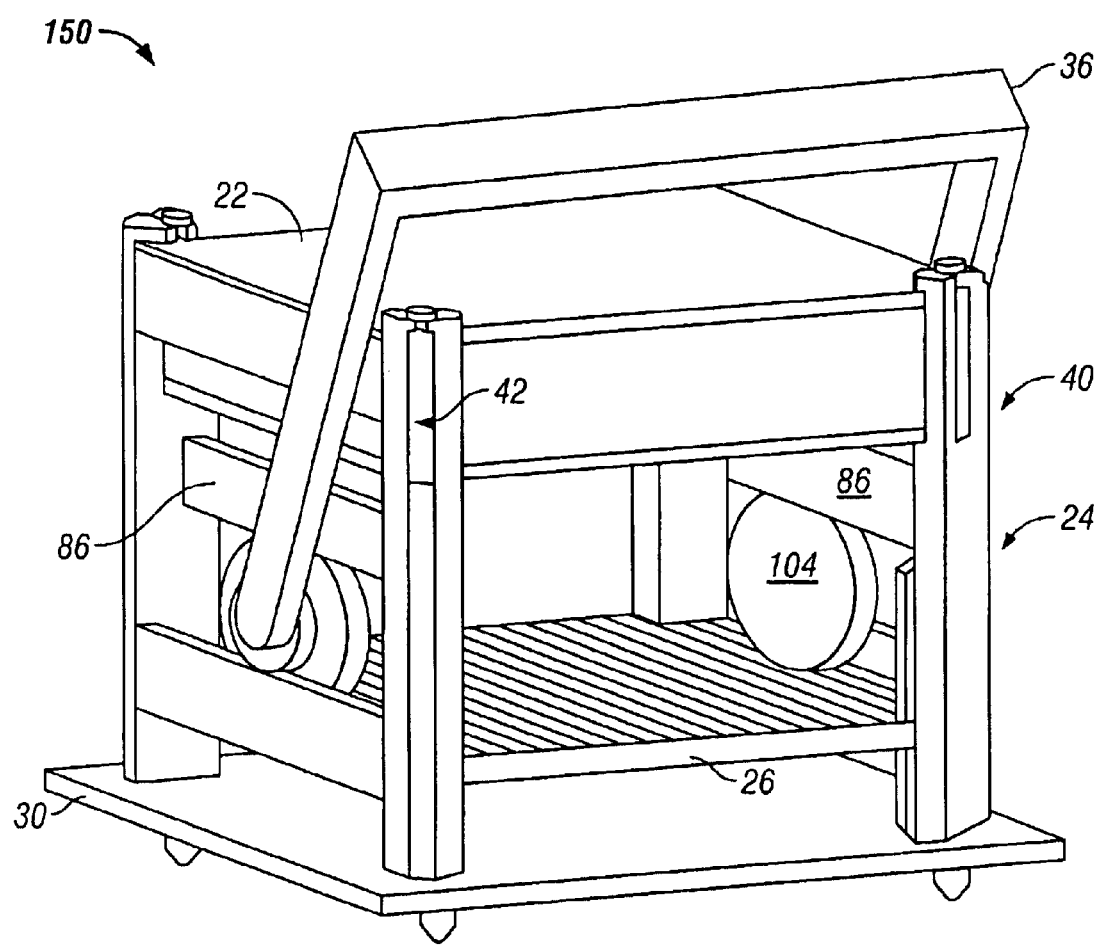
FIG. 10 is a perspective view of an alternative embodiment of a heat sink integrated retention system in accordance with the present invention.

FIG. 10 illustrates an integrated heat sink and retention system 150. The integrated heat sink and retention system 150 is similar to the integrated system 10 and corresponding elements between the integrated systems 150 and 10 are given the same reference numbers in FIG. 10. In the integrated system 150, the heat sink base 26 is without fins. The integrated system 150 includes the heat sink base 26, a fan 22 and a housing 24. The system is mounted to the circuit board 30. The cam lever 36 drives from the heat sink base 26 to rotate cams 104. The cams 104 engage the cross beams 86 to operate the actuator 42 within the frame members 40 to lock the integrated system 150 to the circuit board 30 as previously described. The cams 104 engage the actuator cross beam 86 which elastically deforms to generate a downward compressive force from the heat sink base 26 the heat generating component (not shown in FIG. 10).

The embodiments thus described provide a heat sink and housing integrated into a single unit. The integrated system provides a cost effective alternative to attachment mechanisms requiring clips and other hardware. Having no hardware requirement, use of the integrated retention system also reduces product assembly time.

While the invention has been described in terms of various specific embodiments, those skilled in the art will recognize that the invention can be practiced with modification within the spirit and scope of the claims.

What is claimed is:

1. A heat sink assembly for a circuit board component, said assembly comprising:
   a heat sink base;
   a frame coupled to said base said frame including a leg and an actuator, said leg including a board lock and said actuator including a retention lug receivable in said board lock; and
   a cam positionable relative to said base and operable for urging said retention lug into said board lock, thereby expanding said board lock to lock said heat sink base to the circuit board component.

2. The heat sink assembly of claim 1, wherein said frame includes a pair of said legs, each said leg including a channel for receiving a portion of said actuator.

3. The heat sink assembly of claim 1, wherein said actuator comprises:
   a first post and a second post, each said post having an upper end, a lower end, and a shaft portion therebetween, said lower end including a respective said retention lug; and
   a cross beam interconnecting said shaft portions of said posts.

4. The heat sink assembly of claim 1, wherein said cam includes a lever coupled to said cam, said cam engaging said actuator to move said actuator relative to said frame from a first position to a second position to lock said heat sink base to the circuit board component.

5. The heat sink assembly of claim 1, wherein said cam includes a lever coupled to said cam, said cam engaging said actuator to move said actuator relative to said frame from a first position to a second position to lock said heat sink base to the circuit board component, and wherein said heat sink remains in said locked position when said lever is rotated from said second position to said first position.

6. A heat sink assembly for a circuit board component, said assembly comprising:
   a heat sink base;
   an actuator coupled to said base; and
   a board lock for coupling said base to said circuit board in heat transfer relationship to the circuit board component, said board lock comprising a pair of retention barbs, wherein said actuator is configured to spread said pair of retention barbs and apply a normal force to a surface of the circuit board component when said actuator is moved from a first position to a second position.

7. The heat sink assembly of claim 6, further comprising a cam coupled to said actuator, said cam configured to move said actuator between said first and second positions.

8. The heat sink assembly of claim 6, further comprising a frame, said frame including a leg having an attachment end that includes said board lock.

9. The heat sink assembly of claim 6, further comprising a frame, said frame including a pair of legs, each said leg including a channel for receiving a portion of said actuator.

10. The heat sink assembly of claim 6, wherein said actuator comprises:
    a first post and a second post, each said post having an upper end, a lower end, and a shaft portion therebetween, said lower end including a retention lug; and
    a cross beam interconnecting said shaft portions of said posts.

11. The heat sink assembly of claim 6, wherein said actuator includes a retention lug receivable between said retention barbs to spread said retention barbs when said actuator is moved to said second position.

12. The heat sink assembly of claim 6, further comprising a cam coupled to said actuator, said cam configured to move said actuator between said first and second positions, said actuator including retention lugs received in recesses in said retention barbs to hold said actuator in said second position when said cam is rotated from said second position to said first position.

13. The heat sink assembly of claim 6, further comprising a cam coupled to said actuator, wherein said cam engages a resilient beam on said actuator to bias said heat sink base toward the circuit board component.

14. A heat sink retention assembly comprising:

a heat sink base;

a frame, said frame including a board lock configured to be received in a circuit board;

an actuator received in said frame and movable with respect to said frame from an open position to a locked position wherein said board lock is activated to retain said retention assembly on the circuit board; and a cam disposed between said frame and said actuator, said cam being rotatable from a first position to a second position to move said actuator between said open position and said locked position.

15. The retention assembly of claim 14, wherein said frame includes a pair of legs, and said actuator includes a pair of posts, each said leg including a channel for receiving a corresponding post of said actuator.

16. The retention assembly of claim 14, wherein said actuator comprises:

a first post and a second post, each said post having an upper end, a lower end, and a shaft portion therebetween, said lower end including a retention lug; and a cross beam interconnecting said shaft portions of said posts.

17. The retention assembly of claim 14, wherein said actuator remains in said locked position when said cam is rotated from said second position to said first position.

18. The retention assembly of claim 14, wherein said actuator includes a resilient cross beam interconnecting first and second posts, said resilient cross beam biasing said frame toward the circuit board when said cam is rotated to said locked position.

* * * * *